United States Patent
Yun et al.

(10) Patent No.: US 11,000,935 B2
(45) Date of Patent: May 11, 2021

(54) POLISHING PAD THAT MINIMIZES OCCURRENCE OF DEFECTS AND PROCESS FOR PREPARING THE SAME

(71) Applicant: SKC solmics Co., Ltd., Gyeonggi-do (KR)

(72) Inventors: Sunghoon Yun, Gyeonggi-do (KR); Hye Young Heo, Gyeonggi-do (KR); Jong Wook Yun, Gyeonggi-do (KR); Jang Won Seo, Gyeonggi-do (KR); Jaein Ahn, Gyeonggi-do (KR)

(73) Assignee: SKC solmics Co., Ltd., Gyeonggi-do (KR)

(*) Notice: Subject to any disclaimer, the term of this patent is extended or adjusted under 35 U.S.C. 154(b) by 0 days.

(21) Appl. No.: 16/790,388

(22) Filed: Feb. 13, 2020

(65) Prior Publication Data

US 2020/0306921 A1  Oct. 1, 2020

(30) Foreign Application Priority Data

Mar. 27, 2019  (KR) .................. 10-2019-0035204

(51) Int. Cl.
| | |
|---|---|
| B24B 37/22 | (2012.01) |
| B24B 37/24 | (2012.01) |
| B24B 7/22 | (2006.01) |
| B24D 3/00 | (2006.01) |
| B24D 11/00 | (2006.01) |
| H01L 21/321 | (2006.01) |
| B24B 37/20 | (2012.01) |

(52) U.S. Cl.
CPC ............... *B24B 37/22* (2013.01); *B24B 7/22* (2013.01); *B24B 7/228* (2013.01); *B24B 37/20* (2013.01); *B24B 37/24* (2013.01); *B24B 37/245* (2013.01); *B24D 3/00* (2013.01); *B24D 11/00* (2013.01); *H01L 21/3212* (2013.01)

(58) Field of Classification Search
CPC ........... B24B 7/22; B24B 7/228; B24B 37/20; B24B 37/22; B24B 37/24; B24B 37/245; B24D 3/00; B24D 11/00; B24D 11/003

USPC .................................. 451/526, 530, 533
See application file for complete search history.

(56) References Cited

U.S. PATENT DOCUMENTS

| | | | | |
|---|---|---|---|---|
| 3,471,276 A | * | 10/1969 | Bragaw, Jr. ......... | C08L 2666/14 51/293 |
| 9,321,947 B2 | * | 4/2016 | Manning .................. | B24D 3/00 |
| 2005/0215414 A1 | * | 9/2005 | Kawai ..................... | C03C 3/095 501/69 |
| 2006/0022368 A1 | * | 2/2006 | Lee ......................... | B24B 37/24 264/51 |
| 2009/0313906 A1 | * | 12/2009 | Upadhyay ................ | B24D 3/18 51/296 |
| 2011/0171890 A1 | * | 7/2011 | Nakayama ............... | B24B 37/24 451/526 |
| 2017/0014970 A1 | * | 1/2017 | Itoyama ............... | C08G 18/4854 |
| 2017/0361421 A1 | * | 12/2017 | Willumstad ........ | C08G 18/3243 |
| 2020/0384605 A1 | * | 12/2020 | Gadinski ................ | B24B 37/22 |

FOREIGN PATENT DOCUMENTS

| | | |
|---|---|---|
| JP | 2009-274208 A1 | 11/2009 |
| JP | 5959390 B2 | 8/2016 |
| KR | 10-2016-0027075 | 3/2016 |
| TW | 201641546 A | 12/2016 |

OTHER PUBLICATIONS

Office Action issued by Taiwanese Patent Office dated Sep. 3, 2020.
Office Action issued by Korean Patent Office dated Apr. 7, 2020.

* cited by examiner

*Primary Examiner* — Eileen P Morgan
(74) *Attorney, Agent, or Firm* — IP & T Group LLP

(57) ABSTRACT

The present invention relates to a polishing pad that minimizes the occurrence of defects and a process for preparing the same, Since the polishing pad comprises fine hollow particles having shells, the glass transition temperature (Tg) of which is adjusted, the hardness of the shells and the shape of micropores on the surface of a polishing layer are controlled. Since the content of Si in the polishing layer is adjusted, it is possible to prevent the surface damage of a semiconductor substrate caused by hard additives. As a result, the polishing pad can provide a high polishing rate while minimizing the occurrence of defects such as scratches on the surface of a semiconductor substrate during the CMP process.

12 Claims, No Drawings

POLISHING PAD THAT MINIMIZES OCCURRENCE OF DEFECTS AND PROCESS FOR PREPARING THE SAME

The present application claims priority of Korean patent application number 10-2019-0035204 filed on Mar. 27, 2019, which is incorporated herein by reference in its entirety.

TECHNICAL FIELD

The present invention relates to a polishing pad that minimizes the occurrence of defects and a process for preparing the same. More specifically, the embodiments relate to a polishing pad that provides high polishing rates while reducing the occurrence of defects at the time of polishing a semiconductor substrate or the like, a process for preparing the same, and a process for preparing a semiconductor device by using the same.

BACKGROUND ART

The chemical mechanical planarization (CMP) process in a process for preparing semiconductors refers to a step in which a semiconductor substrate such as a wafer is fixed to a head and in contact with the surface of a polishing pad mounted on a platen, and the wafer is then chemically treated by supplying a slurry while the platen and the head are relatively moved, to thereby mechanically planarize the irregularities on the semiconductor substrate.

A polishing pad is an essential member that plays an important role in such a CMP process. In general, a polishing pad comprises a polishing layer composed of a polyurethane-based resin and a support layer, and the polishing layer has, on its surface, grooves for a large flow of a slurry and pores for supporting a fine flow thereof. The pores in a polishing layer may be formed by using a solid phase foaming agent having a fine hollow structure, a liquid phase foaming agent using a volatile liquid, a gas phase foaming agent such as an inert gas, or the like, or by generating a gas by a chemical reaction.

Since the polishing layer comprising pores directly interacts with the surface of a semiconductor substrate during the CMP process, it affects the processing quality of the surface of the semiconductor substrate. In particular, the polishing rate and the occurrence of defects such as scratches during the CMP process sensitively vary with the components, physical properties, and pore shape of the polishing layer. Materials having a higher hardness than that of a semiconductor substrate among the raw materials that constitute a polishing layer may be the foaming agent and additives. In particular, in the case of a solid phase foaming agent having a fine hollow structure, the hardness of the shells or the additives contained in the shells and other hard additives used in the preparation of a polishing layer may cause deterioration of the quality of a semiconductor substrate.

Specifically, the shells of a solid phase foaming agent constitute the shells of open pores formed on the surface of a polishing layer. The hardness of the shells is generally high to prevent the breakage of the solid phase foaming agent and to maintain the shape of the pores in the preparation of a polishing pad. In addition, a release agent such as silica may be added in the production and storage of a solid phase foaming agent to prevent the fusion between the fine hollow particles. In addition, a silicone-based additive may be used in the process of preparing a polishing layer. Such hard shells and additives may cause scratches and surface damage to the semiconductor substrate during the CMP process.

Meanwhile, the conventional solid phase foaming agent having a fine hollow structure may need to have shells with excellent mechanical properties in order to prevent the breakage of the solid phase foaming agent and to maintain the shape of pores in the process of preparing a polishing pad. As described above, however, the hard shells or the additives contained in the shells and other hard additives used in the preparation of a polishing layer may cause defects such as scratches to the semiconductor substrate during the CMP process.

As a result of the research conducted by the present inventors, it was discovered that the polishing rate can be enhanced while the defects are significantly reduced during the CMP process by adjusting the glass transition temperature of the shells of fine hollow particles, whereby the hardness of the shells and the shape of pores on the surface of a polishing layer are controlled, and by adjusting the content of the hard Si-based release agent used for the prevention of fusion between the fine hollow particles and other hard additives used in the preparation of a polishing layer.

DISCLOSURE OF THE INVENTION

Technical Problem

The present invention aims to provide a polishing pad that provides high polishing rates while reducing the occurrence of defects at the time of polishing a semiconductor substrate during the CMP process, a process for preparing the same, and a process for preparing a semiconductor device by using the same.

Solution to the Problem

The present invention provides a polishing pad, which comprises a polishing layer, wherein the polishing layer comprises fine hollow particles having shells, the glass transition temperature (Tg) of the shells of the fine hollow particles is 110° C. or less, and the polishing layer satisfies the following Relationship (1).

$$0 < \frac{DSi}{STg} \leq 15 \qquad (1)$$

In the above Relationship, DSi is the content of Si (ppmw, parts per million by weight) with respect to the total weight of the polishing layer, STg is the glass transition temperature (° C.) of the shells of the fine hollow particles, and DSi/STg is a ratio between the values exclusive of units.

According to another embodiment, there is provided a process for preparing a polishing pad, which comprises preparing a first raw material composition comprising a urethane-based prepolymer; preparing a second raw material composition comprising a curing agent; preparing a third raw material composition comprising fine hollow particles having shells; sequentially or simultaneously mixing the first raw material composition with the second raw material composition and the third raw material composition to prepare a raw material mixture; and injecting the raw material mixture into a mold and curing it to obtain a polishing layer, wherein the glass transition temperature (Tg) of the shells of the fine hollow particles is 110° C. or less, and the polishing layer satisfies the above. Relationship (1).

According to still another embodiment, there is provided a process for preparing a semiconductor device, which comprises polishing the surface of a semiconductor substrate using a polishing pad, wherein the polishing pad comprises a polishing layer, the polishing layer comprises fine hollow particles having shells, the glass transition temperature (Tg) of the shells of the fine hollow particles is 110° C. or less, and the polishing layer satisfies the above Relationship (1).

Advantageous Effects of the Invention

The polishing pad according to the embodiment comprises fine hollow particles having shells, the glass transition temperature (Tg) of which is adjusted, whereby the hardness of the shells and the shape of pores on the surface of a polishing layer are controlled. Since it has an adjusted content of Si in the polishing layer, it is possible to prevent the surface damage of a semiconductor substrate caused by hard additives.

As a result, the polishing pad can provide a high polishing rate while minimizing the occurrence of defects such as scratches on the surface of a semiconductor substrate during the CMP process, Thus, the polishing pad may be applied to a process of preparing a semiconductor device, which comprises a CMP process, to provide a semiconductor device of excellent quality.

BEST MODE FOR CARRYING OUT THE INVENTION

Hereinafter, the present invention will be described in detail.

In the description of the following embodiments, in the case where each layer, pad, or sheet is mentioned to be formed "on" or "under" another layer, pad, or sheet, it means not only that one element is "directly" formed on or under another element, but also that one element is "indirectly" formed on or under another element with other element(s) interposed between them.

In addition, all numerical ranges related to the physical properties, dimensions, and the like of a component used herein are to be understood as being modified by the term "about," unless otherwise indicated.

Polishing Pad

The polishing pad according to one embodiment comprises a polishing layer, wherein the polishing layer comprises fine hollow particles having shells, the glass transition temperature (Tg) of the shells of the fine hollow particles is 110° C. or less, and the polishing layer satisfies the following Relationship (1).

$$0 < \frac{DSi}{STg} \leq 15 \quad (1)$$

In the above Relationship, DSi is the content of Si (ppmw, parts per million by weight) with respect to the total weight of the polishing layer, STg is the glass transition temperature (° C.) of the shells of the fine hollow particles, and DSi/STg is a ratio between the values exclusive of units.

In the above Relationship (1), DSi/STg, for example, may be 1 to 10, 1 to 8, 1 to 5, 1 to 3, 3 to 15, 5 to 15, 7 to 15, 3 to 10, or 3 to 7, Specifically, in the above Relationship (1), DSi/STg may be 1 to 5.

If the value of Relationship (1) indicating the correlation between the glass transition temperature (Tg) of the shells of the fine hollow particles and the content of Si in the polishing layer is within the preferred range, it is possible to prevent the deformation of micropores in the process of preparing a polishing pad, thereby securing a smooth flow channel for a slurry, while minimizing such defects as scratches that may occur on the surface of a semiconductor substrate during the CMP process.

Polishing Layer

The polishing layer comprises a polyurethane resin and may be porous.

The urethane-based polymer may be formed by a reaction between a urethane-based prepolymer and a curing agent.

Specifically, the polishing layer may be formed from a composition that comprises a urethane-based prepolymer, a curing agent, fine hollow particles, and other additives.

Fine Hollow Particles

The polishing layer comprises fine hollow particles having shells.

The fine hollow particles form micropore on the surface (i.e., polishing surface) of the polishing layer. If the hardness of the shells is high, they may cause damage to the surface of a semiconductor substrate interacting with them. Thus, it is necessary to adjust the hardness of the shells, which can be implemented by adjusting the glass transition temperature (Tg) of the shells. That is, the occurrence of defects such as scratches on the surface of a semiconductor substrate during the CMP process can be minimized by lowering the glass transition temperature of the shells.

Meanwhile, if the glass transition temperature of the shells is too low, the fusion between the fine hollow particles may occur in the preparation process. In addition, due to the deformation and breakage of the particles, the micropores formed on the surface of the polishing layer may be deformed or removed, thereby rendering it difficult to secure a smooth flow channel for a slurry.

Thus, the glass transition temperature of the shells needs to be adjusted to a specific range to address the above problems.

In the polishing pad according to the embodiment, the glass transition temperature (Tg) of the shells of the fine hollow particles is 110° C. or lower.

For example, the glass transition temperature (Tg) of the shells of the fine hollow particles may be 70° C. to 110° C., 80° C. to 110° C., 90° C. to 110° C., 100° C. to 110° C., 70° C. to 100° C., 70° C. to 90° C., or 80° C. to 100° C. Specifically, the glass transition temperature (Tg) of the shells of the fine hollow particles may be 70° C. to 90° C.

Within the preferred range, it is possible to prevent the deformation of micropores in the process of preparing a polishing pad, thereby securing a smooth flow channel for a slurry, while minimizing such defects as scratches that may occur on the surface of a semiconductor substrate during the CMP process.

The average particle diameter of the fine hollow particles may be 10 μm to 100 μm, 10 μm to 70 μn, 10 μm to 50 μm, 30 μm to 100 μm, 30 μm to 70 μm, or 30 μm to 60 μm. Specifically, the fine hollow particles may have an average particle diameter of 10 μn to 70 μm. More specifically, the fine hollow particles may have an average particle diameter of 30 μm to 60 μm. Within the preferred range, it is more advantageous to improving the performance of the CMP process at an appropriate slurry flow rate.

The thickness of the shells of the fine hollow particles may be 0.01 μm to 1.5 μm. For example, it may be 0.05 μm to 1 μm. As the fine hollow particles have shells having a thickness within the above range, an appropriate pore structure may be formed in the polishing layer, thereby imparting an appropriate hardness for improving the polishing performance to the surface of the polishing pad.

In such event, the average particle diameter of the fine hollow particles refers to the total diameter encompassing the thickness of the shells of the fine hollow particles. More specifically, the fine hollow particles may be expanded as they are heated in the process of preparing a polishing pad. In such event, the average particle diameter of the fine hollow particles may be the average particle diameter after such expansion.

The fine hollow particles may comprise a gas or liquid phase foaming agent therein. That is, the gas or liquid phase foaming agent may be encapsulated inside the fine hollow particles by the shells. Such a gas or liquid phase foaming agent may be thermally expanded or vaporized to increase its volume when it is heated, whereby the shells may be extended. Thus, the shells of the fine hollow particles may be made of a material that is softened when it is heated.

For example, the shells of the fine hollow particles may comprise a thermoplastic resin. Specifically, they may comprise at least one selected from the group consisting of a vinylidene chloride-based copolymer, an acrylonitrile-based copolymer, a methacrylonitrile-based copolymer, and an acrylic-based copolymer.

In addition, the fine hollow particles may comprise a hydrocarbon having a low molecular weight therein. Specifically, the fine hollow particles may comprise a hydrocarbon having 1 to 7 carbon atoms therein. The hydrocarbon having 1 to 7 carbon atoms may be at least one selected from the group consisting of ethane, ethylene, propane, propene, n-butane, isobutane, butene, isobutene, n-pentane, isopentane, neopentane, n-hexane, and heptane.

The fine hollow particles may be employed in an amount of 0.1% by weight to 3% by weight with respect to the total weight of the polishing layer. Alternatively, the fine hollow particles may be employed in an amount of 1% by weight to 2% by weight with respect to the total weight of the polishing layer. Within the preferred range, it is more advantageous to implementing a slurry flow rate that can improve the performance of the CMP process.

The polishing layer comprises a plurality of micropores. Specifically, the micropores may be formed by the fine hollow particles. Thus, the average diameter of the micropores may be the same as the average particle diameter of the fine hollow particles.

The micropores may have a structure of an opened cell or a closed cell. Specifically, the polishing layer has a plurally of micropores of an opened cell exposed to the outside, in which the micropores may be derived from the fine hollow particles. More specifically, the micropores of an opened cell may be formed as the shells of the fine hollow particles are partly cut during the conditioning of the surface of the polishing layer.

That is, the fine hollow particles form micropores of an opened cell on the surface of the polishing layer, which serve as a microfluidic channel of a slurry applied on the polishing layer during the CMP process.

The total area of the micropores in the area of the surface (i.e., polishing surface) of the polishing layer may be 30% to 60%, 35% to 50%, or 35% to 43%.

In addition, the polishing layer may contain 20% by volume to 70% by volume of micropores with respect to the total volume of the polishing layer. That is, the porosity of the polishing layer may be 20% by volume to 70% by volume.

In addition, the polishing layer may have grooves on its surface for mechanical polishing. The grooves may have a depth, a width, and a spacing as desired for mechanical polishing, which are not particularly limited.

Characteristics of the Polishing Layer

In the polishing pad according to the embodiment, the content of Si in the polishing layer may be less than 1,000 ppmw. The content of Si is based on weight. That is, when the total weight of the polishing layer is 100% by weight, the content of Si in the polishing layer may be less than 0.1% by weight.

For example, the content of Si in the polishing layer may be less than 800 ppmw, less than 700 ppmw, less than 600 ppmw, less than 500 ppmw, or less than 400 ppmw. Specifically, the content of Si in the polishing layer may be less than 500 ppmw. Alternatively, the content of Si in the polishing layer may be 100 ppmw to 900 ppmw, 100 ppmw to 700 ppmw, or 100 ppmw to 500 ppmw.

In such event, the content of Si in the polishing layer may be measured by an ICP analysis.

Si in the polishing layer may be derived from various sources. For example, it may be derived from a silicon-based release powder, for example, $SiO_2$ powder or the like used in the preparation of the fine hollow particles. Alternatively, it may be derived from a silicon-based additive used in the preparation of the polishing layer. As a result, it is possible to minimize the occurrence of defects such as scratches on the surface of a semiconductor substrate during the CMP process using the polishing pad by adjusting the content of Si in the polishing layer to the above range.

As a specific example, the glass transition temperature of the shells of the fine hollow particles may be 70° C. to 110° C., and the content of Si with respect to the total weight of the polishing layer may be less than 1,000 ppmw. As another specific example, the glass transition temperature of the shells of the fine hollow particles may be 70° C. to 90° C., and the content of Si with respect to the total weight of the polishing layer may be less than 500 ppmw.

The thickness of the polishing layer may be 0.8 mm to 5.0 mm, 1.0 mm to 4.0 mm, 1.0 mm to 3.0 mm, 1.5 mm to 2.5 mm, 1.7 mm to 2.3 mm, or 2.0 mm to 2.1 mm. Within the above range, the basic physical properties as a polishing pad can be sufficiently exhibited while the particle size variation of the micropores between the upper and lower portions is minimized.

The polishing layer may have a surface hardness of 50 shore D to 70 shore D. For example, the polishing layer may have a surface hardness of 50 shore D to 60 shore D, 60 shore D to 70 shore D, or 55 shore D to 65 shore D.

The polishing pad may have a polishing rate (or removal rate) of 700 Å/min or more against a tungsten layer. Alternatively, the polishing pad may have a polishing rate (or removal rate) of 700 Å/min or more against a tungsten layer.

Support Layer

In addition, the polishing pad may further comprise a support layer disposed on one side of the polishing layer.

The support layer serves to support the polishing layer and to absorb and disperse an impact applied to the polishing layer. Thus, the hardness of the support layer may be smaller than the hardness of the polishing layer.

The support layer may be in a porous structure containing micropores. For example, the support layer may be composed of a nonwoven fabric or a suede.

Adhesive Layer

The polishing pad may further comprise an adhesive layer interposed between the polishing layer and the support layer.

The adhesive layer serves to adhere the polishing layer and the support layer to each other.

The adhesive layer may comprise a hot melt adhesive. The hot melt adhesive may be at least one selected from the group consisting of a polyurethane resin, a polyester resin, an ethylene-vinyl acetate resin, a polyimide resin, and a polyolefin resin.

Specifically, the hot melt adhesive may be at least one selected from the group consisting of a polyurethane resin and a polyester resin.

Process for Preparing a Polishing Pad

The process for preparing a polishing pad according to one embodiment comprises preparing a first raw material composition comprising a urethane-based prepolymer; preparing a second raw material composition comprising a curing agent; preparing a third raw material composition comprising fine hollow particles having shells; sequentially or simultaneously mixing the first raw material composition with the second raw material composition and the third raw material composition to prepare a raw material mixture; and injecting the raw material mixture into a mold and curing it to obtain a polishing layer, wherein the glass transition temperature (Tg) of the shells of the fine hollow particles is 110° C. or less, and the content of Si with respect to the total weight of the polishing layer is less than 1,000 ppmw.

The prepolymer contained in the first raw material generally refers to a polymer having a relatively low molecular weight wherein the degree of polymerization is adjusted to an intermediate level for the sake of conveniently molding a product in the process of producing the same. For example, the weight average molecular weight (Mw) of the urethane-based prepolymer may be 500 g/mole to 3,000 g/mole, 600 g/mole to 2,000 g/mole, or 700 g/mole to 1,500 g/mole. A prepolymer may be molded by itself, or after a further reaction with another polymerizable compound or a curing agent, to form a final product.

The urethane-based prepolymer comprises a prepolymerization reaction product of at least one diisocyanate monomer and at least one polyol.

The at least one diisocyanate monomer may be at least one aromatic diisocyanate monomer and/or at least one aliphatic diisocyanate monomer. For example, it may be at least one isocyanate selected from the group consisting of toluene diisocyanate (TDI), naphthalene-1,5-diisocyanate, p-phenylene diisocyanate, tolidine diisocyanate, diphenylmethane diisocyanate (MDI), hexamethylene diisocyanate (HDI), dicyclohexylmethane diisocyanate (H12MDI), and isophorone diisocyanate.

The curing agent contained in the second raw material may be at least one of an amine compound and an alcohol compound. Specifically, the curing agent may comprise at least one compound selected from the group consisting of an aromatic amine, an aliphatic amine, an aromatic alcohol, and an aliphatic alcohol.

For example, the curing agent may be at least one selected from the group consisting of 4,4'-methylenebis(2-chloroaniline) (MOCA), diethyltoluenediamine (DETDA), diaminodiphenyl methane, diaminodiphenyl sulphone, m-xylene diamine, isophoronediamine, ethylenediamine, diethylenetriamine, triethylenetetramine, polypropylenediamine, polypropylenetriamine, ethylene glycol, diethylene glycol, dipropylene glycol, butanediol, hexanediol, glycerin, trimethylolpropane, and bis(4-amino-3-chlorophenyl)methane.

The type and configuration of the fine hollow particles contained in the third raw material composition are as described above.

A release agent such as $SiO_2$ may be used to prevent the fusion of the fine hollow particles during storage. Such a release agent, however, may have high hardness and may damage the surface of a semiconductor substrate during the CMP process.

Thus, the content of $SiO_2$ in the fine hollow particles used in the preparation of the third raw material composition may be 10% by weight or less, 7% by weight or less, 5% by weight or less, 3% by weight or less, or 1.% by weight or less.

Specifically, the fine hollow particles in the preparation of the third raw material composition may comprise $SiO_2$ in an amount of 5% by weight or less.

In addition, the step of preparing the raw material mixture may be carried out by mixing the first raw material composition with the second raw material composition, followed by further mixing thereof with the third raw material composition, or by mixing the first raw material composition with the third raw material composition, followed by further mixing thereof with the second raw material composition.

In addition, the step of preparing the raw material mixture may be carried out under the condition of 50° C. to 150° C. if necessary, it may be carried out under vacuum defoaming conditions.

The step of injecting the raw material mixture into a mold and curing it may be carried out under the temperature condition of 60° C. to 120° C. and the pressure condition of 50 kg/m$^2$ to 200 kg/m$^2$.

In addition, the above preparation process may further comprise the steps of cutting the surface of a polishing pad thus obtained, machining grooves on the surface thereof, bonding with the lower part, inspection, packaging, and the like. These steps may be carried out in a conventional manner for preparing a polishing pad.

Since the polishing pad comprises fine hollow particles having shells, the glass transition temperature (Tg) of which is adjusted, the hardness of the shells and the shape of micropores on the surface of the polishing layer are controlled. Since the content of Si in the polishing layer is adjusted, it is possible to prevent the surface damage of a semiconductor substrate caused by the hard additives. As a result, the polishing pad can provide a high polishing rate while minimizing the occurrence of defects such as scratches on the surface of a semiconductor substrate during the CMP process.

Process for Preparing a Semiconductor Device

The process for preparing a semiconductor device according to one embodiment comprises polishing the surface of a semiconductor substrate using the polishing pad according to the embodiment.

That is, the process for preparing a semiconductor device according to one embodiment comprises polishing the surface of a semiconductor substrate using a polishing pad, wherein the polishing pad comprises a polishing layer, the polishing layer comprises fine hollow particles having shells, the glass transition temperature (TO of the shells of the fine hollow particles is 110° C. or less, and the content of Si with respect to the total weight of the polishing layer is less than 1,000 ppmw.

Specifically, once the polishing pad according to the embodiment is attached to a platen, a semiconductor substrate is disposed on the polishing pad. In such event, the surface of the semiconductor substrate is in direct contact with the polishing surface of the polishing pad. A polishing slurry may be sprayed on the polishing pad for polishing. Thereafter, the semiconductor substrate and the polishing pad rotate relatively to each other, so that the surface of the semiconductor substrate is polished.

Embodiments for Carrying Out the Invention

Hereinafter, the present invention will be described in detail with reference to examples. These examples are set forth to illustrate the present invention, and the scope of the present invention is not limited thereto.

Examples and Comparative Example

A casting machine equipped with tanks and feeding lines for a prepolymer, a curing agent, an inert gas, and a reaction rate controlling agent was provided. A urethane-based prepolymer (NCO content: 8.0%, brand name: PUC-450D, SKC) was charged to the prepolymer tank, and fine hollow particles in which a gas phase foaming agent had been encapsulated by shells composed of a thermoplastic resin was fed thereto in an amount as shown in Table 1. They were mixed for 24 hours. A curing agent (bis(4-amino-3-chlorophenyl)methane, Ishihara) was charged to the curing agent tank, and a nitrogen ($N_2$) gas and a tertiary amine-based compound as a reaction rate controlling agent (brand name: A1, Air Product) were prepared.

The raw materials were stirred while they were fed to the mixing head at constant rates through the respective feeding lines. In such event, the reaction rate controlling agent was fed at a rate of 0.5% by weight based on the total feeding rate of the raw materials. The inert gas (nitrogen) was fed at a rate shown in Table 1 below. The urethane-based prepolymer and the curing agent were fed while their equivalent ratio was adjusted, wherein the total feeding amount was maintained at a rate of 10 kg/min:

The mixed raw materials were injected into a mold (1,000 mm×1,000 mm×3 mm) and solidified to obtain a molded article in the form of a solid cake. Thereafter, the surfaces of the molded article were ground to obtain a polishing layer sheet having a thickness to 2 mm Thereafter, grooves were formed on the surface of the polishing layer sheet, which was then laminated with a support layer by a hot melt adhesive to obtain a polishing pad.

Test Example

The polishing pads prepared in the Examples and Comparative Example were tested for the following items. The results are shown in Table 1.

(1) Glass Transition Temperature (Tg)

The glass transition temperature (Tg) of the fine hollow particles was measured with a differential scanning calorimeter (DSC) at a temperature elevation rate of 20° C./min from 40° C. to 180° C.

(2) Content of Si in a Polishing Layer.

The content of Si in the polishing layer sample was measured by luminescence spectroscopy using a high-frequency inductively coupled plasma (ICP).

(3) Polishing Rate

The polishing pad sample was mounted on the platen of a CMP machine, and a silicon wafer having a diameter of 300 mm on which a tungsten (W) layer had been deposited by a CVD process was set with the tungsten layer thereof facing the polishing surface of the polishing pad. The tungsten layer was polished under a polishing load of 4.0 psi while it was rotated at a speed of 150 rpm for 60 seconds and a fumed silica slurry was supplied onto the polishing pad at a rate of 250 ml/min. Upon completion of the polishing, the wafer was detached from the carrier, mounted in a spin dryer, washed with distilled water, and then dried with nitrogen for 15 seconds.

The changes in the film thickness of the dried wafer before and after the polishing were measured using a spectral reflectometer type thickness measuring instrument (SI-F80R, Kyence). The polishing rate was calculated using the following equation.

Polishing rate (Å/min)=thickness of the tungsten layer reduced by polishing (Å)/polishing time (min)

(4) Number of Defects

After the same CMP process as in the above step (3) was carried out using the polishing pad sample, the surface of the wafer was observed using a wafer inspection equipment (AIT XP+, KLA Tencor) to measure the number of scratches generated on the wafer by the polishing (threshold: 150, die filter threshold: 280).

TABLE 1

| | Item | C. Ex. 1 | C. Ex. 2 | C. Ex. 3 | C. Ex. 4 | Ex. 1 | Ex. 2 | Ex. 3 |
|---|---|---|---|---|---|---|---|---|
| Fine hollow particles | Tg of shells (° C.) | 109 | 111 | 85 | 65 | 81 | 109 | 97 |
| | Avg. diameter (μm) | 35 to 45 | 40 to 60 | 25 to 55 | 30 to 50 | 30 to 50 | 35 to 55 | 20 to 40 |
| | * Content of $SiO_2$ (% by weight) | 60 to 70 | 3 to 4 | 45 to 55 | 1 to 2 | 1 to 2 | 1 to 2 | 1 to 2 |
| | * Feed rate (% by weight) | 1.0 | 1.0 | 1.0 | 1.0 | 1.0 | 1.0 | 1.0 |
| * Feed rate of nitrogen (% by volume) | | 10 | 10 | 10 | 10 | 10 | 10 | 10 |
| Polishing pad characteristics | * Content of Si (ppmw) | 9670 | 1200 | 3450 | — | 350 | 450 | 560 |
| | * Polishing rate (Å/min) | 746 | 758 | 754 | — | 750 | 757 | 745 |
| | * Defects (counts) | 354 | 288 | 257 | — | 53 | 189 | 117 |
| * Content of Si/Tg of shells | | 88.7 | 10.8 | 40.6 | — | 4.3 | 4.1 | 5.8 |

* Content of $SiO_2$: % by weight of $SiO_2$ with respect to 100% by weight of fine hollow particles
* Feed rate of fine hollow particles: % by weight of fine hollow particles with respect to the total weight of a polishing layer
* Feed rate of nitrogen: % by volume of nitrogen with respect to 100% by volume of the total feed rate of raw materials
* Content of Si: Content of Si in a polishing layer measured by an ICP analysis (ppmw)
* Polishing rate: Polishing rate against a tungsten layer (Å/min)
* Defects: Number of defects generated upon polishing using a polishing pad
* Content of Si/Tg of shells: Ratio between the content of Si (ppmw) in a polishing layer and the Tg (° C.) of shells (exclusive of units)

As shown in Table 1 above, the polishing pads of Examples 1 to 3 had a Tg of the shells of the fine hollow particles of 110° C. or less and a ratio of the content of Si to the Tg of the shells of 15 or less, whereas the polishing pads of Comparative Examples 1 to 3 had a Tg of the shells and/or a content of Si falling outside the above ranges.

As a result of the tests, the polishing pads of Examples 1 to 3 were comparable to the polishing pads of Comparative Examples 1 to 3 in terms of polishing rate, but the rate of defects in the former was remarkably low.

Meanwhile, the fine hollow particles in Comparative Example 4 were fused with each other. Thus, a polishing pad could not be prepared. This was because a small amount of the release agent ($SiO_2$) was used for the fine hollow particles of Comparative Example 4, and the Tg of the shells was lower than 70° C., failing to prevent the fusion between the fine hollow particles.

In contrast, even if a small amount of the release agent ($SiO_2$) was used for the fine hollow particles as in Examples 1 to 3, when the Tg of the shells was as high as 70° C. or higher, the fine hollow particles were hardly fused, whereby there was no problem in the preparation of the polishing pad.

The invention claimed is:

1. A polishing pad, which comprises a polishing layer, wherein the polishing layer comprises fine hollow particles having shells,
the glass transition temperature (Tg) of the shells of the fine hollow particles is 110° C. or less, and
the polishing layer satisfies the following Relationship (1):

$$0 < \frac{DSi}{STg} \leq 15 \qquad (1)$$

in the above Relationship,
DSi is the content of Si (ppmw, parts per million by weight) with respect to the total weight of the polishing layer,
STg is the glass transition temperature (° C.) of the shells of the fine hollow particles, and
DSi/STg is a ratio between the values exclusive of units.

2. The polishing pad of claim 1, wherein the DSi/STg in the above Relationship (1) is 1 to 5.

3. The polishing pad of claim 1, wherein the glass transition temperature (Tg) of the shells of the fine hollow particles is 70° C. to 110° C., and the content of Si in the polishing layer is less than 1,000 ppmw.

4. The polishing pad of claim 1, wherein the glass transition temperature (Tg) of the shells of the fine hollow particles is 70° C. to 90° C., and the content of Si in the polishing layer is less than 500 ppmw.

5. The polishing pad of claim 1, wherein the fine hollow particles have an average particle diameter of 10 µm to 70 µm.

6. The polishing pad of claim 5, wherein the fine hollow particles have an average particle diameter of 30 µm to 60 µm.

7. The polishing pad of claim 1, wherein the fine hollow particles are employed in an amount of 0.1% by weight to 3% by weight with respect to the total weight of the polishing layer.

8. The polishing pad of claim 1, wherein the shells of the fine hollow particles comprise at least one selected from the group consisting of a vinylidene chloride-based copolymer, an acrylonitrile-based copolymer, a methacrylonitrile-based copolymer, and an acrylic-based copolymer.

9. The polishing pad of claim 1, wherein the fine hollow particles comprise a hydrocarbon having 1 to 7 carbon atoms therein.

10. The polishing pad of claim 1, wherein the polishing pad has a polishing rate (or removal rate) of 700 Å/min or more against a tungsten layer.

11. The polishing pad of claim 1, wherein the polishing layer has a plurality of micropores of an opened cell exposed to the outside, in which the micropores are derived from the fine hollow particles.

12. The polishing pad of claim 1, wherein the polishing layer has a surface hardness of 50 shore D to 70 shore D.

* * * * *